United States Patent [19]

Kaplan et al.

[11] 4,321,470
[45] Mar. 23, 1982

[54] ELECTRON FLOOD EXPOSURE APPARATUS

[75] Inventors: Michael Kaplan, Franklin Township, Somerset County; Eugene S. Poliniak, Willingboro; Dietrich Meyerhofer, Princeton, all of N.J.

[73] Assignee: RCA Corporation, New York, N.Y.

[21] Appl. No.: 164,069

[22] Filed: Jun. 30, 1980

[51] Int. Cl.³ ............... A61K 27/02; G01K 1/08; H01J 29/74
[52] U.S. Cl. ................... 250/398; 250/400; 250/492.2; 313/439
[58] Field of Search .......... 250/398, 400, 492 R, 250/492 A; 313/432, 434, 439

[56] References Cited

U.S. PATENT DOCUMENTS 2,860,251 11/1958 Pakswer et al. ............ 250/492 A
3,035,203 5/1962 Fischman.
3,133,220 5/1964 Whyman.
3,900,760 8/1975 Glenn et al. ................ 313/439

Primary Examiner—Harold A. Dixon
Attorney, Agent, or Firm—Birgit E. Morris; Edward J. Sites

[57] ABSTRACT

An electron flood exposure apparatus is disclosed which is comprised of an electron gun for providing an electron beam; a dispersing means for converting the electron beam into an electron flood; a post dispersion collimation and acceleration grid; and a target holder for holding a microlithographic resist which is to be exposed by the flood of electrons after collimation and acceleration by the acceleration grid.

7 Claims, 1 Drawing Figure

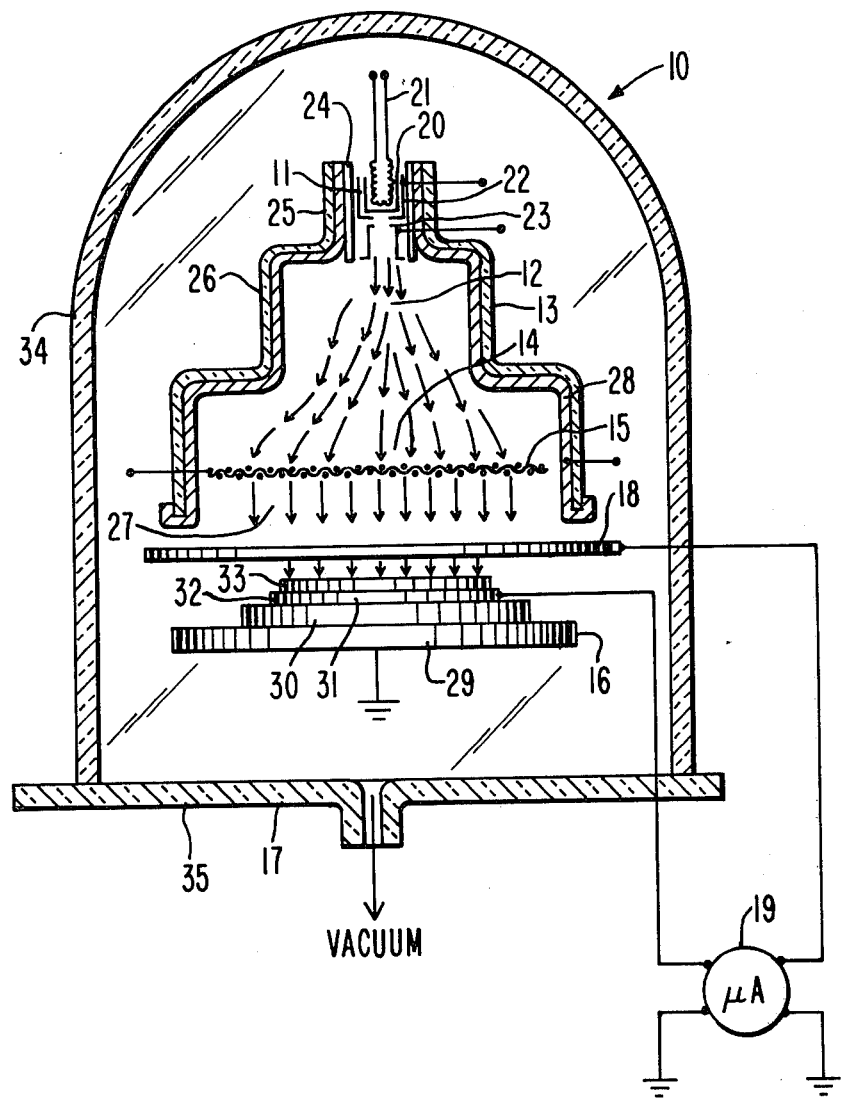

ELECTRON FLOOD EXPOSURE APPARATUS

This invention is concerned with an apparatus for exposing microlithographic resists with a flood of electrons. More particularly this invention relates to electron flood exposure apparatus which can provide a substantially uniform flux of electrons over the entire area of a target resist which is desired to be exposed.

BACKGROUND OF THE INVENTION

Microlithography is a widely used industrial process which is employed for the production of surface relief images having extremely small pattern elements. Microlithography is used for example by the electronics industry in the manufacture of large scale integrated circuits which can have circuit elements which are in the submicron to a few micron size range.

In microlithography a film of material known as a resist is exposed with a high energy source. The resists which are generally employed are polymeric materials which, when exposed to a high energy source, are altered in their solubility to become either more soluble or less soluble in selected solvents. By exposing the resist in preselected areas and thereafter treating the exposed resist with a solvent, the more soluble areas after exposure can be selectively removed to provide a surface relief pattern in the resist. The surface relief pattern is then used in further processing steps to produce the desired final product.

Various high energy sources can be used to expose resists. These sources include for example visible light, ultraviolet radiation, and an electron beam. Each of the forms of energy which are currently employed for exposing resists have certain inherent problems. Ultraviolet exposure apparatus has a relatively low initial cost and low operating cost. However, with ultraviolet radiation exposure, and especially with visible light exposures, there is a limitation on the resolution capability and the size of the patterns which can be produced because of the relatively long wavelengths of these forms of energy. Electron beam radiation can be used to produce relief images having substantially smaller pattern elements and having a high degree of resolution. Electron beam lithography, however, must be conducted with apparatus which has an extremely high initial capital cost and further has a very high cost of operation. A typical apparatus which is suitable for electron beam exposures in which resists are exposed to produce surface relief patterns which have extremely small pattern elements and a high degree of resolution is described in U.S. Pat. No. 3,909,737 issued to R. J. Collier.

The high initial cost and high operating costs of suitable electron beam exposure systems have made them impractical for laboratory scale evaluations and for the commercial manufacture of circuits and the like which are produced in relatively low volumes or sold at a low cost per unit.

Accordingly, it would be highly advantageous if apparatus could be provided having the fine geometry capabilities and the high resolving properties of the electron beam exposure systems now employed, but which would have both a lower initial capital cost and lower operating costs on the level of conventional ultraviolet exposure apparatus so as to be feasible for both laboratory scale experiments and evaluations and for commercial production of limited numbers of parts.

SUMMARY OF THE INVENTION

In accordance with this invention an apparatus is provided for the flood exposure of microlithographic resists. In the apparatus of this invention an electron beam is diffused into a flood of electrons, the electron flood is then collimated and accelerated and then used to expose a film of a microlithographic resist.

BRIEF DESCRIPTION OF THE DRAWING

The drawing is a schematic cross-sectional illustration of the electron flood exposure apparatus of this invention.

DETAILED DESCRIPTION OF THE INVENTION

The electron flood exposure apparatus 10 of this invention is comprised of electron gun 11 for providing an electron beam 12; a dispersing means 13 for converting the electron beam 12 into an electron flood 14; a post dispersion collimation and acceleration grid 15; and a target holder 16 for holding a microlithographic resist which is to be exposed by the flood of electrons after collimation and acceleration by the acceleration grid 15. Each of the above components of electron flood exposure apparatus 10 is mounted within a vacuum chamber 17. As illustrated, the apparatus 10 further includes an optional shutter 18 and optional meters to measure the amount of energy provided by the electron flood.

The electron gun 11 is conventional in design. The gun consists of a cathode 20, a heater for the cathode 21, which is electrically connected to a power source (not shown), an acceleration grid 22, and a collimating grid 23 which are each electrically connected to a power source (not shown). Electron gun 11 is mounted in a Teflon sleeve 24 in a neck portion 25 of the dispersion means 13. When the electron gun 11 is operated the cathode 20 of the gun 11 is maintained at a cathode potential of about from $-1$ KV to about $-20$ KV (or more). The electrons are emitted by electron gun 11 in the form of an electron beam 12.

The dispersing means 13 is comprised of a funnel shaped member 26 which is preferably made of glass. As illustrated, the funnel member 26 has a stepped wall structure; however, the walls can likewise be made in a conical configuration if desired. It is important, however, that the walls of the funnel shaped member 26 diverge outwardly from the neck 25 where the electron gun 11 is mounted to the exit end 27 of the funnel shaped member 26. The walls of the funnel shaped member 26 diverge in an amount which is sufficient to accommodate the width of the flood of electrons 14. The interior of the funnel shaped member 26 is coated with a layer of electrically conductive material 28. The conductive layer 28 covers the entire interior of the funnel shaped member 26 and extends over the edge of the exit end 27 and slightly up the exterior surface of the funnel shaped member. The conductive layer 28 is connected to a controllable power source (not shown) so that it can be controlled to a potential which causes the electron beam 12 to be dispersed into an electron flood 14.

The post dispersion acceleration grid 15 is positioned adjacent to the exit end 27 of the funnel shaped member 26. Preferably the acceleration grid 15 is positioned slightly within and across the width of the funnel shaped member 26 so as to intercept substantially the entire electron flood. The acceleration grid 15 is preferably a fine metal mesh screen, for example, about 34 micrometers on 100 micrometer centers. The mesh is electrically connected to a power source and in operation is maintained at a relatively high potential relative to the conductive layer 28 so as to cause the electrons passing through the grid 15 to be accelerated. In addition to accelerating the electrons in the electron flood, the grid likewise collimates the electrons as indicated by the arrows showing the electron flood 14.

Positioned below the acceleration grid 15 is the target holder 16. The target holder 16 has a main support plate 29 on which there is a pad of a dielectric material 30. The target holder 16 is electrically connected to ground. As shown in the illustration, a resist media 31 which consists of a conductive substrate 32 and a film of a microlithographic resist 33 is supported on the dielectric layer 30 on the main support plate 29. The substrate 32 is also connected to ground and preferably includes metering apparatus 19 which measures the amount of energy provided by the flood of electrons upon exposure of the resist. In the preferred embodiment of this invention the target holder 16 includes a motor (not shown) to rotate the resist medium 31 in a plane parallel to the post dispersion acceleration grid 15. The rotation of the resist medium is advantageous in that it ensures an even more uniform exposure of the film of resist 33 by the collimated accelerated electron flood.

As illustrated, the apparatus 10 further includes a shutter 18 between the post dispersion grid 15 and the target holder 16. By operation of the shutter it is possible to blank off the electron flood from the resist medium as desired. The shutter 18 is connected to ground and preferably also includes metering means 19. By use of the metering means 19 with the shutter 18 it is possible to adjust the apparatus 10 to the desired exposure rate prior to actually exposing the target to the electron flood 14.

All of the component parts described above are mounted within a vacuum chamber 17. The vacuum chamber as illustrated consists of a bell jar 34 which is demountably engaged with a base plate 35 which has a vacuum outlet.

In operation the bell jar 34 is removed from the base plate 35. A resist medium 31 is mounted on the dielectric support 30. The resist films formed on the substrate 32 of the resist medium 31 are conventional in nature and can be such materials such as polymethylmethacrylate or a polyolefin sulfone. The resist is formed on the substrate as a film by conventional methods. To obtain a patterned surface relief image a mask (not shown) having the desired pattern defined therein is placed either in contact with or in close proximity to the film of resist 33 in the manner which heretofore was used for exposure with ultraviolet radiation. If the apparatus 10 is equipped with a shutter 18, the shutter 18 is closed when initially setting up the apparatus 10 for exposure. The bell jar 34 is placed over the assembled apparatus and a vacuum is established in the interior of the vacuum chamber.

Electric power is then turned on to the electron gun 11, the layer of conductive material 28 on the inside of the funnel shaped member 26 and to the post dispersion acceleration grid 15. The potential of the various grids 22, 23, 15, and the conductive layer 28 are established so that typical potentials relative to the cathode are such that electron gun grids 22, 23 are maintained at about +60 volts, the conductive layer 28 is maintained at about −60 volts and the post deflection acceleration grid 15 is maintained at about +60 volts. The total current can be adjusted between about 0.01 and 5 microamps by varying the voltage to the heater element 21 of the electron gun assembly 11. With the apparatus of this invention as shown in the drawing, a controllable current density of about between 0.001 to about 1 microamp per centimeter square can be maintained across the film of resist 33 which is being exposed with a uniformity of exposure which does not vary more than about 10 percent across the total area of the resist.

During exposure with the apparatus of this invention 10 it is believed that the electron beam 12 emitted by the electron gun 11 is caused to disperse in the manner illustrated by the arrows as the beam is projected into the interior of the dispersion means 13. The beam dispersing means 13 is maintained at a relatively low potential and as such the electron beam after dispersion would be relatively unsuitable for making a microlithographic exposure. In addition, the beam is somewhat unoriented and accordingly, an exposure made with the beam would have relatively poor uniformity and resolution. The post dispersion acceleration grid 15 is maintained at a potential typically +100–200 volts with respect to the cathode so that the post dispersion acceleration grid 15 collimates the electrons and accelerates them towards the target holder 16.

The resist media which are exposed with the apparatus of this invention are far superior than those obtained by the flood exposure with either visible light or ultraviolet radiation and are equivalent to the quality of the exposures obtained using the more expensive and more complex electron beam exposure devices heretofore mentioned.

What is claimed is:

1. A flood exposure apparatus comprising:
   an electron gun to provide an electron beam;
   a dispersing means for converting the electron beam into an electron flood;
   a post dispersion electron flood acceleration grid;
   a target holding means and
   a vacuum chamber;
   said dispersing means being comprised of a funnel shaped member having diverging walls extending out from a neck aperture at the narrow end of said funnel shaped member to the opposite terminal end of said funnel shaped member to define an enlarged exit aperture said funnel shaped member further having a conductive layer on the interior surface thereof which is electrically connected so as to be maintained at a first electrical potential sufficient to disperse an electron beam emitted into the interior of the funnel shaped member into an electron flood;
   said electron gun being mounted in the neck aperture and positioned so as to project an electron beam into the interior of the funnel shaped member towards the exit aperture thereof;
   said post dispersion acceleration grid being positioned across and parallel to the exit aperture and being adapted to be maintained at a second potential higher than said first potential whereby the flood of electrons passing through said grid are collimated and accelerated towards the target holding means;
   said target holding means including apparatus for holding a microlithographic resist in the accelerated collimated electron flood emitted from the post dispersion acceleration grid;

said electron gun, dispersing means, post dispersion acceleration grid and target holding means being positioned within the interior of said vacuum chamber whereby when a beam of electrons is emitted by the electron gun into the interior of dispersing means, the beam is converted into an electron flood, the electron flood is then collimated and accelerated by the post dispersion electron beam acceleration grid to provide a collimated accelerated flood of electrons which is projected to a resist medium held by the target holding means whereby the resist is exposed with a substantially uniform flood of electrons.

2. The apparatus according to claim 1 which further includes a shutter means positioned between the post dispersion electron flood acceleration grid and the target holder whereby the flood of electrons can be blanked off from a target held by said target holding means.

3. The apparatus according to claim 2 wherein the shutter is electrically connected to ground.

4. The apparatus according to claim 2 wherein the shutter means is associated with means for measuring the amperage of the electrical energy impinging upon the shutter means.

5. The apparatus according to claim 1 wherein the target holding means is mounted so as to be rotatable in a plane parallel to the post dispersion electron acceleration grid.

6. The apparatus according to claim 1 wherein the target means is electrically connected to ground.

7. The apparatus according to claim 1 wherein the target means is associated with means to determine the amount of energy of the electron flood projected to the target held by the target holder.

* * * * *